United States Patent
Anderson et al.

(10) Patent No.: US 12,504,489 B2
(45) Date of Patent: Dec. 23, 2025

(54) ELECTROMAGNETICALLY SHIELDED ELECTRONIC ASSEMBLY FOR NOISE REDUCTION DURING MAGNETIC RESONANCE IMAGING

(71) Applicant: INNOVERE MEDICAL INC., Markham (CA)

(72) Inventors: Kevan James Thompson Anderson, Cobourg (CA); Jonathan Corey Lee, Toronto (CA); Yen-ta Andy Li, Markham (CA); Smruthi Murali, Markham (CA); Donald Bruce Plewes, Toronto (CA)

(73) Assignee: INNOVERE MEDICAL INC., Markham (CA)

( * ) Notice: Subject to any disclaimer, the term of this patent is extended or adjusted under 35 U.S.C. 154(b) by 148 days.

(21) Appl. No.: 18/281,197

(22) PCT Filed: Mar. 7, 2022

(86) PCT No.: PCT/CA2022/050325
§ 371 (c)(1),
(2) Date: Sep. 8, 2023

(87) PCT Pub. No.: WO2022/187942
PCT Pub. Date: Sep. 15, 2022

(65) Prior Publication Data
US 2024/0142553 A1    May 2, 2024

Related U.S. Application Data

(60) Provisional application No. 63/158,771, filed on Mar. 9, 2021.

(51) Int. Cl.
*G01R 33/422* (2006.01)
*H05K 9/00* (2006.01)

(52) U.S. Cl.
CPC ......... *G01R 33/422* (2013.01); *H05K 9/0015* (2013.01)

(58) Field of Classification Search
CPC . G01R 33/422; G01R 33/5659; H05K 9/0015
See application file for complete search history.

(56) References Cited

U.S. PATENT DOCUMENTS

| | | | | | |
|---|---|---|---|---|---|
| 5,566,040 | A | * | 10/1996 | Cosquer | H05K 9/0037 361/107 |
| 2003/0016518 | A1 | * | 1/2003 | Arz | H05K 9/0001 361/818 |

(Continued)

FOREIGN PATENT DOCUMENTS

WO    WO-2015189786 A1 * 12/2015    ......... G01R 33/3815

OTHER PUBLICATIONS

International Search Report for PCT/CA2022/050325 dated Jun. 1, 2022, 3 pages.

*Primary Examiner* — Daniel R Miller
(74) *Attorney, Agent, or Firm* — Stephen Leonard; Aird & McBurney LP

(57) ABSTRACT

An electromagnetically shielded electronic assembly is disclosed in which electromagnetic shielding and filtering is provided to prevent unwanted radiofrequency energy, generated from an electric device residing within the assembly, from radiating externally. The electronic device resides within a primary shielded region and is coupled, through a filter, to an external electrical conductor that extends externally from the shielding. The filter resides within a secondary shielded region that is electromagnetically shielded from the primary shielded region, with the filter electrically contacting the electromagnetic shielding within the secondary shielding region. The electronic device is housed without being brought into electrically conductive contact with the electromagnetic shielding, such that radiofrequency signals (Continued)

generated by the electronic device can be directed, within a blocking frequency band of the filter, to the electromagnetic shielding, thereby reducing or preventing the internally generated radiofrequency energy, within the blocking frequency band of the filter, from radiating externally.

26 Claims, 8 Drawing Sheets

(56) References Cited

U.S. PATENT DOCUMENTS

| | | |
|---|---|---|
| 2012/0089006 A1 | 4/2012 | Ren et al. |
| 2014/0354279 A1* | 12/2014 | Dumoulin .............. A61B 5/055 324/318 |
| 2017/0212191 A1 | 7/2017 | Biber |

* cited by examiner

ELECTROMAGNETICALLY SHIELDED ELECTRONIC ASSEMBLY FOR NOISE REDUCTION DURING MAGNETIC RESONANCE IMAGING

CROSS-REFERENCE TO RELATED APPLICATION

This application is a National Phase application claiming the benefit of the international PCT Patent Application No. PCT/CA2022/050325, filed on Mar. 7, 2022, in English, which claims priority to U.S. Provisional Patent Application No. 63/158,771, titled "ELECTROMAGNETICALLY SHIELDED ELECTRONIC ASSEMBLY FOR NOISE REDUCTION DURING MAGNETIC RESONANCE IMAGING" and filed on Mar. 9, 2021, the entire contents of which are incorporated herein by reference.

BACKGROUND

The present disclosure relates to the prevention of electromagnetic interference via electromagnetic shielding and filtering. In particular, the present disclosure relates to electronics enclosures and filtering configurations to prevent electromagnetic interference with magnetic resonance imaging systems.

Electronics, especially digital electronics, are susceptible to electromagnetic emissions. These emissions are produced by components that create rapid voltage oscillations. Sources of emissions include but are not limited to digital clocks and switching regulators. The frequencies of emissions include not only the fundamental frequency of the source but also the presence of harmonic frequencies. For example, a digital clock operating at 48 kHz will have emissions at 48 kHz, 96 kHz, and other harmonics. In some cases, electromagnetic emissions can be detectable well into the MHz band.

Magnetic resonance (MR) imaging systems operate in a limited operating bandwidth, within which images are susceptible to degradation from external electromagnetic emissions and noise. For example, a 1.5 T magnetic resonance system operates at within a frequency range of 64 MHz+/−500 kHz and a 3 T system operates at within a frequency range of 128 MHz+/−500 kHz.

SUMMARY

An electromagnetically shielded electronic assembly is disclosed that provides electromagnetic shielding and filtering to prevent unwanted radiofrequency energy, generated from an electric device residing within the assembly, from radiating externally. The electronic device resides within the assembly within a primary shielded region and is coupled, through a filter, to an external electrical conductor that extends externally from the shielding. The filter resides within a secondary shielded region that is electromagnetically shielded from the primary shielded region, with the filter electrically contacting the electromagnetic shielding within the secondary shielding region. The electronic device is housed without being brought into electrically conductive contact with the electromagnetic shielding, such that radiofrequency signals generated by the electronic device can be directed, within a blocking frequency band of the filter, to the electromagnetic shielding, thereby reducing or preventing the internally generated radiofrequency energy, within the blocking frequency band of the filter, from radiating externally.

According, in a first aspect, there is provided a magnetic resonance system comprising:
  a magnetic resonance imaging scanner; and
  an electronic assembly comprising:
    electromagnetic shielding defining a first electromagnetically shielded region and a second electromagnetically shielded region, the second electromagnetically shielded region being electromagnetically shielded from the first electromagnetically shielded region, where the first electromagnetically shielded region and the second electromagnetically shielded region are electromagnetically shielded within at least an operating bandwidth of the magnetic resonance imaging scanner;
    an electronic device residing within the first electromagnetically shielded region;
    an electrical conductor extending, at least in part, external to the electromagnetic shielding; and
    a filter residing within the second electromagnetically shielded region, the filter coupling the electronic device to the electrical conductor through conductive pathways extending through respective portals within the electromagnetic shielding defining the second electromagnetically shielded region, the filter being in electrically conductive contact with the electromagnetic shielding within the second electromagnetically shielded region, where the filter is configured such that radio-frequency electromagnetic energy generated by the electronic device within the operating bandwidth of the magnetic resonance imaging scanner is directed, within the second electromagnetically shielded region, to the electromagnetic shielding, through the contact with the electromagnetic shielding;
  where the electronic device is absent of electrically conductive contact with the electromagnetic shielding and is operable in the absence of connection to a reference potential associated with the electromagnetic shielding, thereby preventing, at least in part, the radio-frequency electromagnetic energy from being radiatively coupled external to the electromagnetic shielding and interfering with the magnetic resonance imaging scanner.

In some example implementations of the system, the electromagnetic shielding comprises a barrier separating the first electromagnetically shielded region from the second electromagnetically shielded region. The second electromagnetically shielded region may be surrounded, at least in part, by the first electromagnetically shielded region.

In some example implementations of the system, the first electromagnetically shielded region is spatially separated from the second electromagnetically shielded region.

In some example implementations of the system, a first portion of the electromagnetic shielding that defines the first electromagnetically shielded region and a second portion of the electromagnetic shielding that defines the second electromagnetically shielded region are in electrically conductive contact.

In some example implementations of the system, at least a portion of the second electromagnetically shielded region is enclosed by an electrically conductive plane of a printed circuit board. The electronic device may be connected to the filter through a conductive trace of the printed circuit board, the filter and the electronic device being connected to the conductive trace by respective vias formed within the printed circuit board. The electromagnetic shielding may be defined such that the first electromagnetically shielded region and the second electromagnetically shielded region are laterally separated on a common side of the printed circuit board. The electrical conductor may be connected to the filter through a second conductive trace. The electrical conductor may be connected to the filter through an additional via defined within the printed circuit board.

In example implementations in which the electromagnetic shielding comprises a first electromagnetically shielded enclosure supporting the printed circuit board and in electrically conductive communication with the electrically conductive plane of the printed circuit board such that the first electromagnetically shielded enclosure and the printed circuit board enclose and electromagnetically shield an internal volume, the electromagnetic shielding may further comprise a second electromagnetically shielded enclosure residing within the internal volume on the printed circuit board and in electrically conductive communication with the electrically conductive plane of the printed circuit board, such that the first electromagnetically shielded region is electromagnetically shielded by the first electromagnetically shielded enclosure, the second electromagnetically shielded enclosure, and a first portion of the electrically conductive plane of the printed circuit board, and where the second electromagnetically shielded region is electromagnetically shielded by the second electromagnetically shielded enclosure and a second portion of the electrically conductive plane of the printed circuit board. The electrical conductor may be connected to the filter through an additional via defined within the printed circuit board.

In some example implementations of the system, the electromagnetic shielding is defined such that the first electromagnetically shielded region and the second electromagnetically shielded region reside on opposing sides of a printed circuit board. The electronic device may be connected to the filter through a via within the printed circuit board.

In example implementations in which the first electromagnetically shielded region is formed by an electromagnetically shielded enclosure residing on a first side of the printed circuit board, the second electromagnetically shielded region may be defined, at least in part, by a flexible electrically conductive sheet adhered to a second side of the printed circuit board such that the filter is covered by the flexible electrically conductive sheet, the flexible electrically conductive sheet being connected to the electrically conductive plane of the printed circuit board, and where the electrical conductor is connected to the filter through a gap between the printed circuit board and the flexible electrically conductive sheet without electrically contacting the flexible electrically conductive sheet. An internal surface of the flexible electrically conductive sheet may be electrically insulating.

In some example implementations of the system, the filter is in electrically conductive communication with the electrically conductive plane of the printed circuit board.

In some example implementations of the system, the electrical conductor is, or is electrically connected to, an antenna.

In some example implementations of the system, the filter is a first filter and the electrical conductor is a first electrical conductor, the electronic assembly further comprising a second filter residing within the second electromagnetically shielded region, the second filter coupling the electronic device to a second electrical conductor and being configured such that radio-frequency electromagnetic energy within the operating bandwidth of the magnetic resonance imaging scanner is directed, within the second electromagnetically shielded region, to the electromagnetic shielding. The first electrical conductor and the second electrical conductor may be connected to a speaker.

In some example implementations of the system, the electronic device is configured to receive, through the electrical conductor, electrical signals generated external to the electromagnetic shielding and is unable to transmit electrical signals to the electrical conductor.

In some example implementations of the system, the electronic device is configured to transmit electrical signals through the electrical conductor and is unable to receive electrical signals transmitted through the electrical conductor.

In some example implementations of the system, the electronic device is configured to transmit electrical signals to and/or receive electrical signals through the electrical conductor.

In some example implementations of the system, the filter is a first filter and the electrical conductor is a first electrical conductor, the electronic assembly further comprising a second filter residing within the second electromagnetically shielded region or within another electromagnetically shielded region that is electromagnetically shielded from the first electromagnetically shielded region, the second filter coupling the electronic device to a second electrical conductor residing, at least in part, external to the electromagnetic shielding, the second filter being in electrically conductive contact with the electromagnetic shielding within the second electromagnetically shielded region or the another electromagnetically shielded region, where the second filter is configured such that radio-frequency electromagnetic energy generated by the electronic device within the operating bandwidth of the magnetic resonance imaging scanner is directed, within the second electromagnetically shielded region or the another electromagnetically shielded region, to the electromagnetic shielding, through the contact with the electromagnetic shielding. The electronic device may be configured to transmit first electrical signals through the electrical conductor and to receive second electrical signals through the second electrical conductor.

In another aspect, there is provided a shielded electronic assembly comprising:
   electromagnetic shielding defining a first electromagnetically shielded region and a second electromagnetically shielded region, the second electromagnetically shielded region being electromagnetically shielded from the first electromagnetically shielded region;
   an electronic device residing within the first electromagnetically shielded region;
   an electrical conductor extending, at least in part, external to the electromagnetic shielding; and
   a filter residing within the second electromagnetically shielded region, the filter coupling the electronic device to the electrical conductor through conductive pathways extending through respective portals within the electromagnetic shielding defining the second electromagnetically shielded region, the filter being in electrically conductive contact with the electromagnetic shielding within the second electromagnetically shielded region, where the filter is configured such that radio-frequency electromagnetic energy generated by the electronic device within a blocking frequency band of the filter is directed, within the second electromagnetically shielded region, to the electromagnetic shielding, through the contact with the electromagnetic shielding;

where the electronic device is absent of electrically conductive contact with the electromagnetic shielding and is operable in the absence of connection to a reference potential associated with the electromagnetic shielding, thereby preventing, at least in part, radio-frequency electromagnetic energy within the blocking band of the filter from being radiatively coupled external to the electromagnetic shielding.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. Unless otherwise specified, the terms "about" and "approximately" mean plus or minus 25 percent or less.

It is to be understood that unless otherwise specified, any specified range or group is as a shorthand way of referring to each and every member of a range or group individually, as well as each and every possible sub-range or sub-group encompassed therein and similarly with respect to any sub-ranges or sub-groups therein. Unless otherwise specified, the present disclosure relates to and explicitly incorporates each and every specific member and combination of sub-ranges or sub-groups.

As used herein, the term "on the order of", when used in conjunction with a quantity or parameter, refers to a range spanning approximately one tenth to ten times the stated quantity or parameter.

Figure 1:
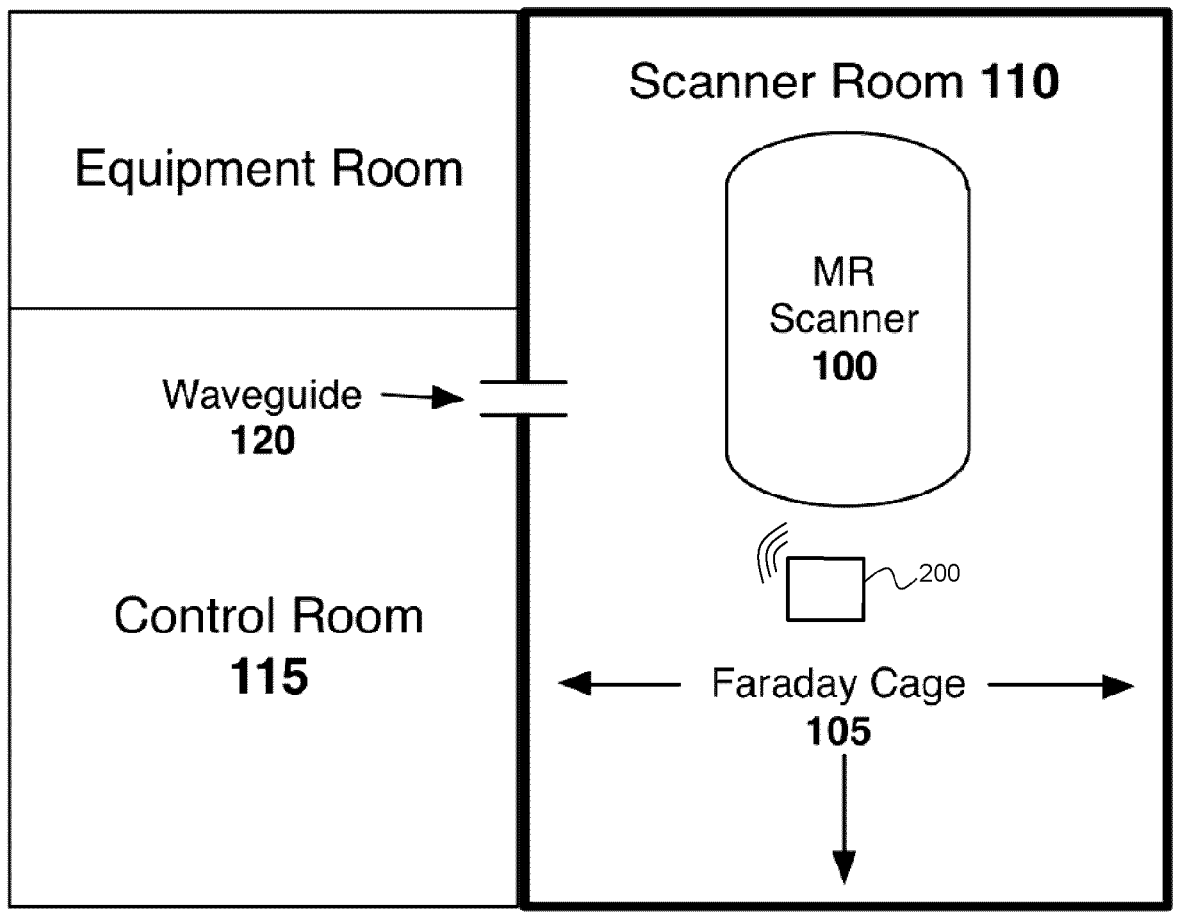
FIG. 1 shows an example magnetic resonance imaging system that includes a wireless electronics assembly residing within the scanner room.

With reference to FIG. 1, an example magnetic resonance (MR) imaging system is illustrated. As shown in the figure, a magnetic resonance scanner 100 is situated in the scanner room 110 which is surrounded by an electromagnetically shielding enclosure (Faraday cage) 105. The electromagnetically shielding enclosure 105 may be formed from conducting material (for example, in solid or mesh form, or a combination thereof, such as thin copper or aluminum interconnected sheets). Such an enclosure attenuates RF signals and prevents them from entering the scanner room 110. External equipment, such as a computer for controlling the magnetic resonance scanner 100, may be located in a control room 115 that is external to the scanner room 110 and operated by an external user. The electromagnetically shielding enclosure may include a waveguide 120 that provides a physical conduit that attenuates radiofrequency energy within the operating frequency band of the magnetic resonance scanner.

As shown in the figure, an electronic device 200 located within the scanner room 110 may produce electromagnetic emissions that are reside, at least in part, within the operating frequency band of the magnetic resonance scanner 100. The relative impact of such noise on the images generated by the magnetic resonance scanner 100 generally depends on the proximity of the electronic device 200 to the magnetic resonance scanner 100, with in-bore devices typically having the most potential to corrupt magnetic resonance images as they are located inside, or close to, the body coil and local imaging coils. Examples of in-bore electronics include, but are not limited to, audio systems, video systems, patient monitoring devices, and interventional devices.

A common approach to limiting the radiofrequency emissions from electronics is to use electromagnetic shielding. For example, an electronic device may be surrounded by a conductive material with low resistivity. Examples of shielding can include metals such as copper or aluminum, conductive foils, and conductive paint.

While the use of shielding is effective in cases in which an electronic device (and all electrical conductors connected to the electronic device) are completely surrounded by electromagnetically shielding material, such a configuration is generally not achievable due to the need for one or more electrical conductors to extend externally from the electromagnetically shielded region. For example, in cases in which wired or wireless signals are transmitted to the electronic device 200 from an external electronic component, and/or when wired or wireless signals are transmitted from the electronic device 200 to an external electronic component, it is necessary for at least one conductor (e.g. one or more signal wires or an antenna) to extend from the electromagnetically shielded region. Non-limiting examples of external electronic components include, but are not limited to, speakers, antennas, power sources (e.g. an external battery) and other electronic devices. In such cases, the presence of one or more electrical conductors that extend from the electromagnetic shielding can act as radiators and emit radiofrequency energy originating from the internal electronic device.

Figure 2A:
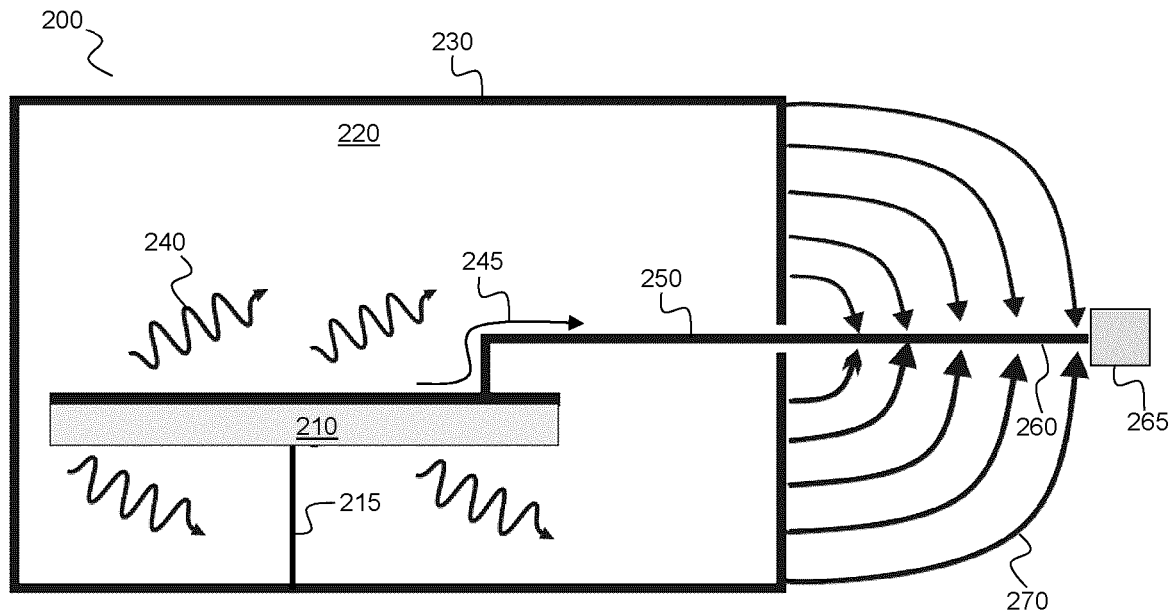
FIG. 2A shows an example electronic assembly that houses an electronic device within an electromagnetic shield. The electronic device is connected to an electronic component that extends beyond the electromagnetic shield. Electromagnetic energy generated by the electronic device is externally radiated beyond the electromagnetic shield.

FIG. 2A illustrates an example of an electronic assembly 200 in which electromagnetic shielding is defeated by the presence of an electrically conductive path extending from within the shielded region to an external region. An electronic device 210 resides within an inner shielded region 220 enclosed by electromagnetic shielding 230 (e.g. an electrically conductive enclosure). The electronic device emits radiofrequency energy, as shown as internally radiated electromagnetic energy 240 and radiofrequency voltage signals 245 propagating along conductive path 250. The electronic device 210 is schematically illustrated by a printed circuit board (other internal components, such as a power supply and/or other electronic components connected to the printed circuit board, are not shown for simplicity). An external electrical component (or device) 265 is electrically connected to the internal electronic device 210 through an electrical conductor 260 extends outside of the inner shielded region 220.

The electrical conductor 260 that emerges from the electromagnetically shielded region 220 can lead to the emission of unwanted radiofrequency energy due to several mechanisms. For example, radiofrequency energy 240 can be externally radiated from the electronic device due to the leakage through a gap or passage through which the electrical conductor 260 emerges beyond the electromagnetic shielding.

Without intending to be limited by theory, the electrical conductor 260 and the electromagnetic shield 230 may act as a radiating antenna, as illustrated in FIG. 2A, resulting in the external radiation of radiofrequency energy, with the electrical conductor 260 acts as the one end of the antenna and the electromagnetic shielding 230 acting as another end of the antenna, and with the circuit being completed through the electrical connection of the electronic device 210 to the electromagnetic shielding 230 via connection 215 (e.g. as a ground connection or to establish a reference potential), as taught by conventional practice in the art. The electric field lines of the antenna that are formed between the conductor and the shield are illustrated at 270.

Figure 2B:
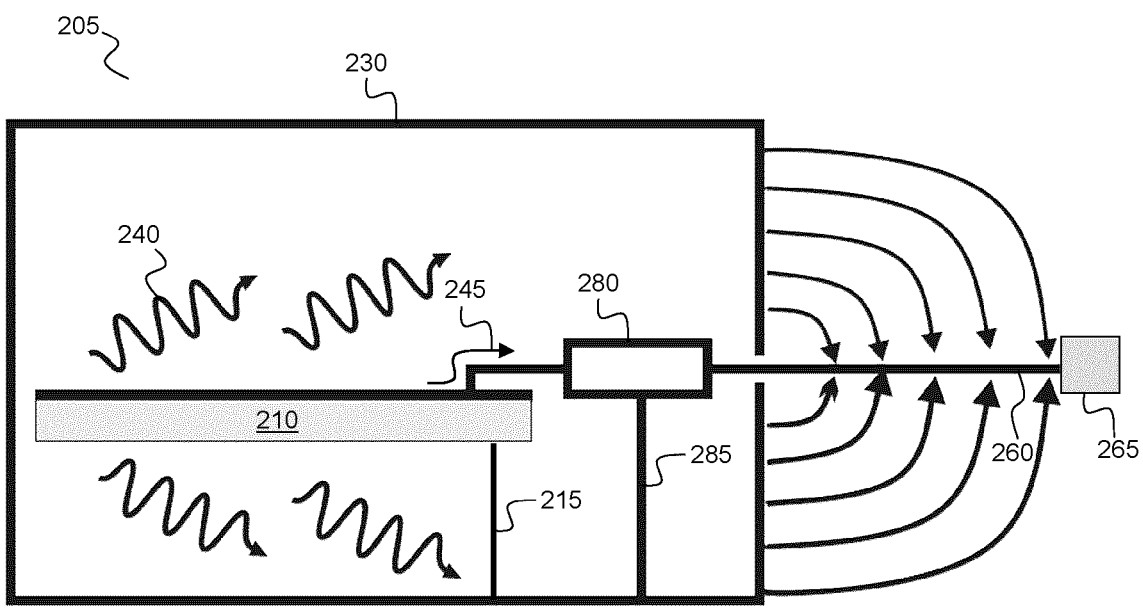
FIG. 2B shows an example electronic assembly that houses an electronic device within an electromagnetic shield. The electronic device is coupled, through a filter, to an electronic component that extends beyond the electromagnetic shield. Despite the presence of the filter within the electromagnetically shielded region, electromagnetic energy generated by the electronic device is radiated externally beyond the electromagnetic shield.

In an attempt to prevent the electrical conductor 260 and/or the electrical conductor and the external electronic component 265 from acting as a radiator of the radiofrequency energy generated internally by the electronic device 210, a filter can be incorporated to filter the radiofrequency voltage signals generated by the electronic device 210. Such a filter may include components such as resistors, capacitors, and inductors. An example implementation of such an embodiment is Illustrated in FIG. 2B, which shows an example electronic assembly 205 in which a filter 280 electrically couples the electronic device 210 to the electrical conductor 260 that extends externally from the electromagnetic shielding 230. The filter is designed to provide filtering within a frequency bandwidth (blocking bandwidth) over which it is desirable to suppress the external emission of the internally generated radiofrequency electromagnetic energy. The filter function may take on any suitable form, such as a low-pass transfer function, a high-pass transfer function, a band-pass filter, a band-stop filter, or other suitable filter functions.

For example, in cases in which the electronic assembly is employed as a component of or with a magnetic resonance imaging system, the filter may be a low-pass filter configured to transmit or receive signals (e.g. audio signals) that have frequencies below the operating bandwidth of the magnetic resonance imaging scanner, and to block passage of signals with frequencies within the operating bandwidth of the magnetic resonance imaging scanner.

In another example implementation involving magnetic resonance imaging, the filter may be a high-pass filter configured to transmit or receive signals that have frequencies above the operating bandwidth of the magnetic resonance imaging scanner, and to block passage of signals with frequencies within the operating bandwidth of the magnetic resonance imaging scanner.

As shown in the figure, the filter 280 is in electrical contact with the electromagnetic shielding 230 via conductive path 285 (as is the electronic device 210, as shown at 215) for filtering (e.g. shunting) the radiofrequency voltage signals 245 to the electromagnetic shielding 230 within a blocking frequency band. However, despite the presence of the filter, radiofrequency energy generated by the electronic device 210 can nonetheless be radiated externally, as shown in the figure. Without intending to be limited by theory, the present inventors suspect that the filter provides a pathway for radiofrequency energy to be coupled to the electrical conductor 260 because radiofrequency energy emitted from the electronic device 210 can induce currents on one or more elements of the filter, and these currents can be transmitted or coupled to the electrical conductor 260 and externally radiated.

Figure 2C:
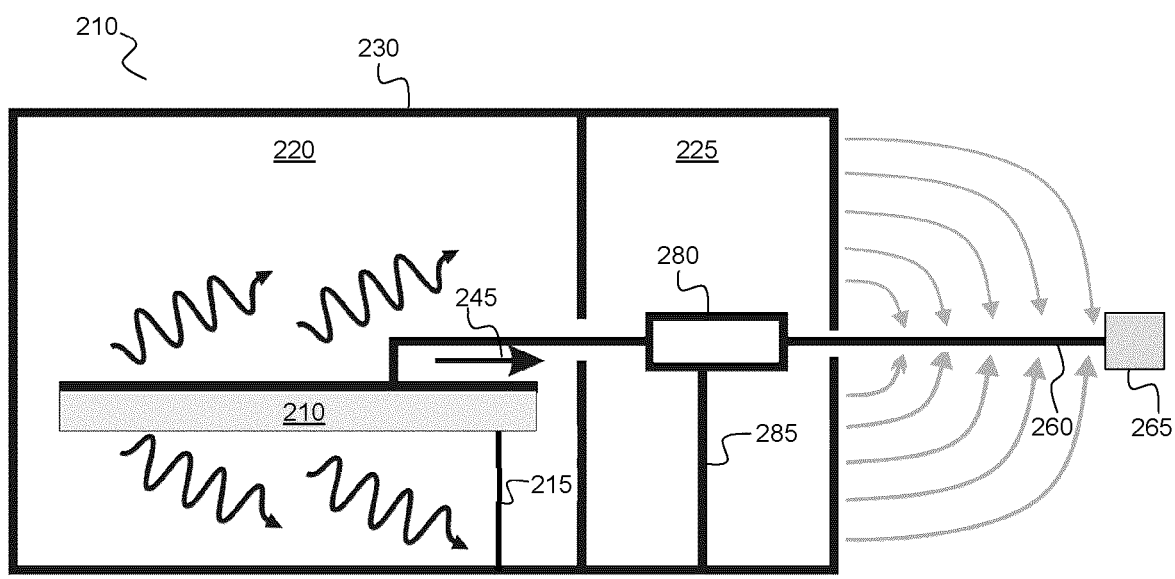
FIG. 2C shows an example electronic assembly that houses an electronic device within an electromagnetic shield. The electronic device is coupled, through a filter, to an electronic component that extends beyond the electromagnetic shield. Despite the presence of the filter within a separate electromagnetically shielded region, electromagnetic energy generated by the electronic device is radiated externally beyond the electromagnetic shield.

In order to address the ineffectiveness of the filter 280 of FIG. 2B in preventing the external coupling of internally generated radiofrequency energy, the filter 280 may be spatially and electromagnetically sequestered within a separate electromagnetically shielded region. An example implementation of such an embodiment is illustrated in FIG. 2C. Unlike the example implementation illustrated in FIG. 2B in which the electronic device 210 and the filter 280 reside within the same electromagnetically shielded region 220, the electromagnetic shielding 230 of the electrical assembly 210 illustrated in FIG. 2C defines an additional electromagnetically shielded region 225 that is electromagnetically shielded from an external region and also from the primary electromagnetically shielded region 220.

The present inventors initially believed that by confining the filter 280 in the secondary electromagnetically shielded region 225 and electrically contacting the filter 280 with the electromagnetic shielding 230 within this secondary electromagnetically shielded region, the filter would be effective in preventing the external coupling and radiation of the internally generated radiofrequency energy. Indeed, without intending to be limited by theory, it was expected that the enhanced spatial filtering provided by the secondary electromagnetic shielding region 225, and the reduction of electromagnetic coupling between the electronic device 210 and one or more components of the filter 280, would significantly reduce or eliminate the external radiation of the internally generated radiofrequency energy within the blocking (rejection) bandwidth of the filter.

However, to the surprise of the present inventors, the configuration shown in FIG. 2C involving a spatially separated filter in a secondary electromagnetically shielded enclosure still resulted in the external radiation of significant internally-generated radiofrequency energy within the rejection band of the filter. Again, without intending to be limited by theory, the present inventors surmised that the inability of the present configuration to efficiently prevent the external radiation of the internally generated radiofrequency energy resulted from the presence of a conductive loop extending back to the electronic device 210 through the electromagnetically shielding 230 and through the connection 215 between the electronic device 210 and the electromagnetic shielding 230.

Figure 3A:
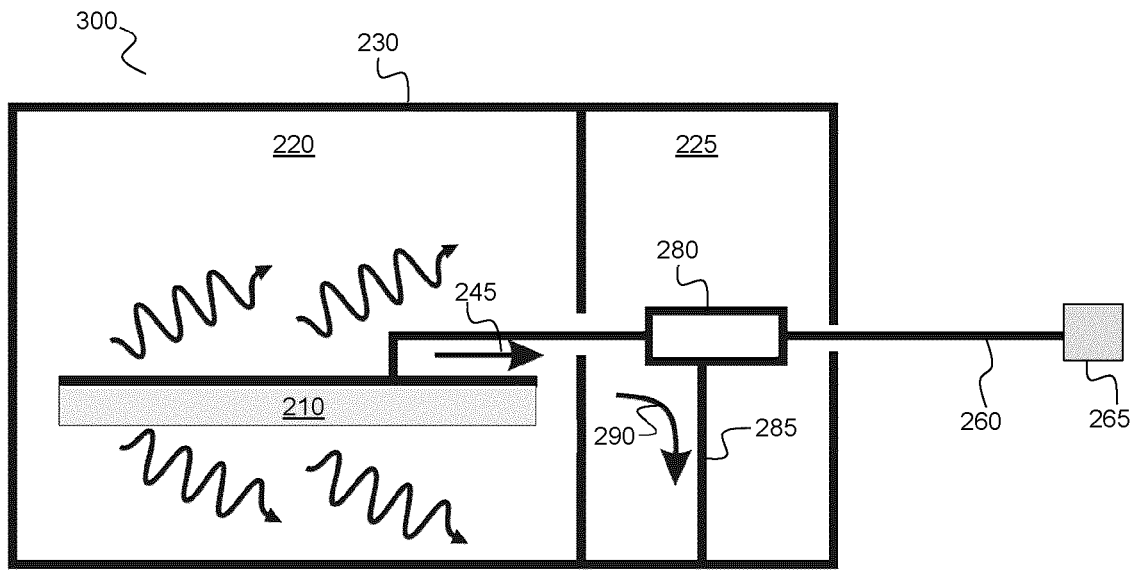
FIG. 3A shows an example electronic assembly that houses an electronic device within an electromagnetic shield. The electronic device is coupled, through a filter, to an electronic component that extends beyond the electromagnetic shield. By incorporating the filter within a separate electromagnetically shielded region and providing the electronic device such that it is absent from electrically conductive contact with the electromagnetic shielding, electromagnetic energy generated by the electronic device is prevented from being externally radiated beyond the electromagnetic shield, despite the extension of the external electrical component beyond the electromagnetic shielding.

With this potential mechanism in mind, the present inventors sought to improve the performance of the configuration shown in FIG. 2C by removing the electrical connection between the electronic device 210 and the electromagnetic shielding 230. An example implementation of such an embodiment is illustrated in FIG. 3A, which shows an example electronic assembly 300 in which the electronic device 210 is absent of an electrically conductive connection with the electromagnetic shielding 230. Instead, the electronic device 210 is only electrically interfaced with the electromagnetic shielding 230 indirectly through the filter 280. For example, unlike the configurations illustrated in FIGS. 2A-2C, the electronic device 210 does not employ or rely on the establishment of a reference voltage defined by the electromagnetic shielding 230. The present inventors found that the example configuration illustrated in FIG. 3A provides superior suppression and prevention of external radiation of the radiofrequency energy that is internally generated by the electronic device 210. Without intending to be limited by theory, the present inventors suspected that the elimination of the return conductive path led to the effective rejection of the radiofrequency voltage signals 245 (generated by the electronic device 210) to the electromagnetic shielding via the conductive path 285, as shown at 290 in FIG. 3A.

Accordingly, in various example embodiments involving an electromagnetically shielded electronic device that is coupled, through a filter, to an external electrical conductor that extends from the electromagnetic shielding, radiofrequency energy generated by the electronic device can be substantially prevented from radiating external to the electromagnetic shielding by (i) configuring the electromagnetic shielding such that the filter resides within a secondary electromagnetically shielded region that is electromagnetically shielded from a primary electromagnetic shielded region within which the electronic device resides, (ii) electrically contacting the filter with the electromagnetic shielding within the secondary shielding region such that radiofrequency signals generated by the electronic device can be directed, within a blocking bandwidth of the filter, to the electromagnetic shielding, and (iii) housing the electronic device within the shielding without bringing the electronic device into electrically conductive contact with the electromagnetic shielding. In some example implementations, the portions of the electromagnetic shielding that define the primary and secondary electromagnetically shielded regions may be in electrically conductive contact.

Figure 3B:
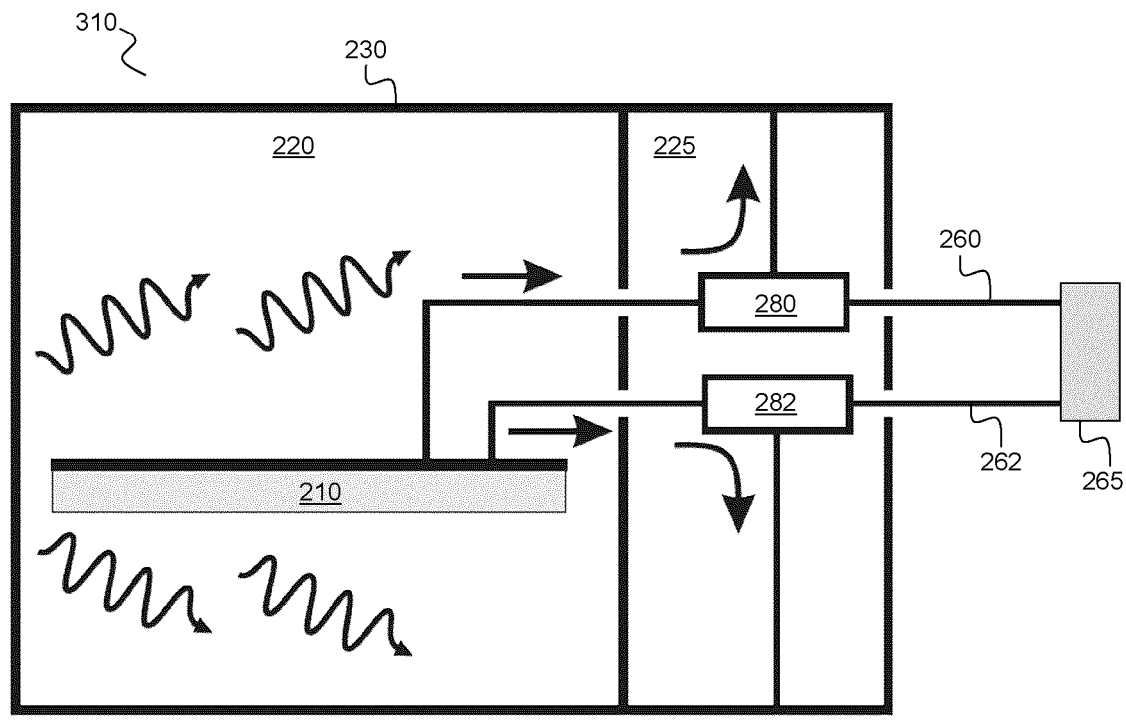
FIG. 3B shows an example electronic assembly in which a second filter is incorporated to electrically couple the electronic device with a second electronic component that resides external to the electromagnetic shielding.

While FIG. 3A illustrates an example implementation involving a filter and a single external electrical conductor 260 (and associated external electronic component 265), it will be understood that other example implementations may include multiple external electrical conductors and respective filters housed in spatially and electromagnetically sequestered regions relative to a primary electromagnetically shielded region in which the electronic device resides. One such example implementation is illustrated in FIG. 3B, in which a second filter 282 is employed to couple the electronic device 210 to a second electrical conductor 262, such that both the electrical conductor 260 and the second electrical conductor 262 are connected to the external electronic component 265. Although the example figure shows filters 280 and 282 both residing in a common secondary electromagnetically shielded region 225, the two filters may be housed in separately shielded regions. Non-limiting examples of electronic components that are typically connected to electronics using multiple conductors include speakers and antennas.

While the filters illustrated in the embodiments shown in FIGS. 3A and 3B have been described as being configured to prevent the external emission, beyond the electromagnetic shielding, of the radiofrequency energy that is internally generated by the electronic device, it will be understood that the electronic device may be configured to transmit electrical signals to an external electrical component and/or to receive electrical signals from the external electrical component. That is, in some cases, a given filter may be configured to permit passage of electrical signals from an external region to the internal electronic device, while also preventing the external radiation of radiofrequency energy that is internally generated by the electronic device 210.

In another example implementation, filters may be incorporated to electrically couple the electronic device with multiple electronic components that reside external to the electromagnetic shielding for separately transmitting and receiving external signals. For example, as shown in the example implementation illustrated in FIG. 3C, a first set of filters 280 and 282 may be employed to permit the transmission of electrical signals, from the electronic device 210 to a first external electronic component 265, within a transmit frequency band (e.g. a transmission frequency band that does not overlap with the operating frequency band of a magnetic resonance imaging scanner) and to prevent the external radiation of radiofrequency energy within a blocking frequency band (e.g. the operating frequency band of a magnetic resonance imaging scanner), while a second set of filters 281 and 283 may be employed to permit the reception of electrical signals, delivered from a second external electronic component 266 to the electronic device 210, within a receive frequency band (e.g. a reception frequency band that does not overlap with the operating frequency band of a magnetic resonance imaging scanner) and to prevent the external radiation of radiofrequency energy within the blocking frequency band (e.g. the operating frequency band of a magnetic resonance imaging scanner). Although the first set of filters 280, 282 and the second set of filters 281, 283 are shown residing in separate electromagnetically shielded regions, the sets of filters may alternatively be provided within a common secondary electromagnetically shielded region.

While many of the present example embodiments may be implemented with an internal power source (e.g. a battery) residing within the electromagnetic shielding for providing electrical power to the electronic device, in other example implementations, external power may be supplied. For example, in FIG. 3C, one of the external electronic components 265 and 266 may be an external power source.

Figure 3C:
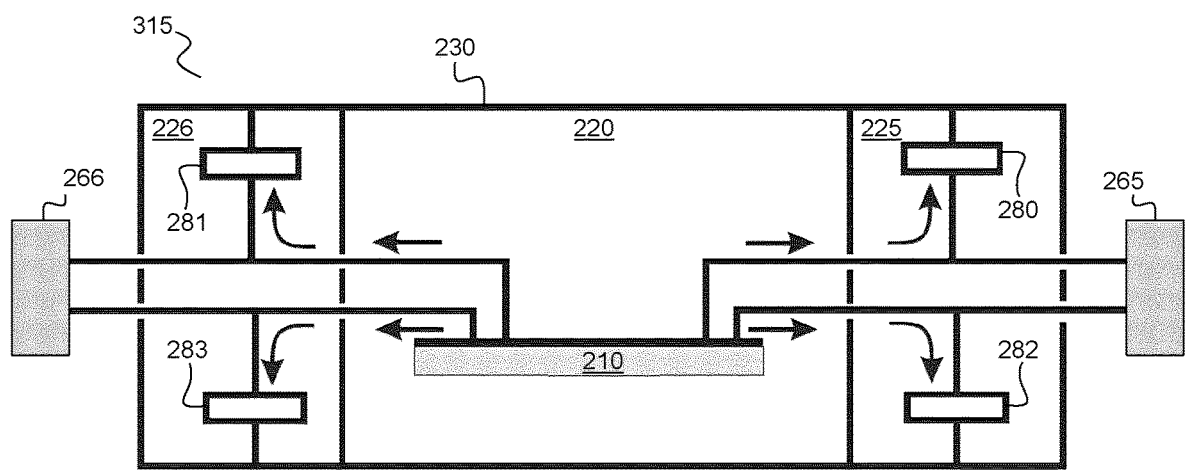
FIG. 3C shows an example electronic assembly in which filters are incorporated to electrically couple the electronic device with multiple electronic components that reside external to the electromagnetic shielding for separately transmitting and receiving external signals or power.

While the example implementations shown in FIGS. 3A-3C illustrate a configuration in which the electromagnetic shielding 230 is not connected to Earth ground, it will be understood that in some example implementations, an Earth ground connection may be made with the electromagnetic shielding 230.

In the example implementations shown in FIGS. 3A-3C, the primary electromagnetically shielded region 220 and the additional electromagnetically shielded regions that house the one or more filters are shown as being separated by a common shielding barrier. In alternative example implementations, the primary electromagnetically shielded region 220 and the additional electromagnetically shielded regions that house the one or more filters may be spatially separated, such as laterally adjacent.

In some example implementations, the electromagnetic shielding is provided such that a secondary electromagnetically shielded region, in which the filter resides, is surrounded, at least in part, by the primary electromagnetically shielded region in which the electronic device resides.

Figure 3D:
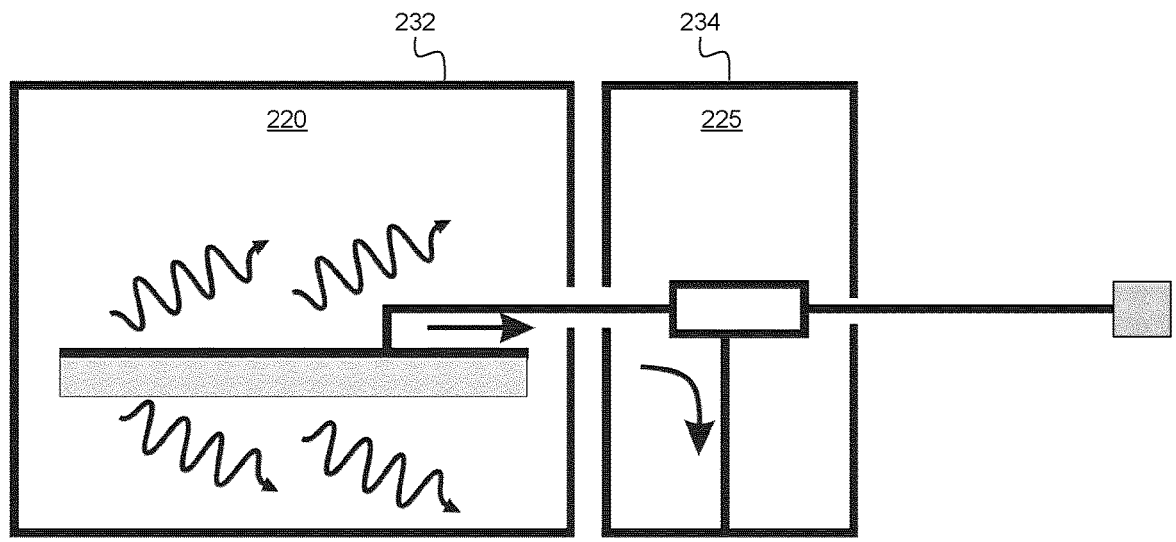
FIG. 3D illustrates an alternative configuration of an example electronic assembly in which the electromagnetic shielding defining the primary electromagnetically shielded region is absent from electrically conductive contact with the electromagnetic shielding defining the secondary electromagnetically shielded region.

In some example implementations, a first portion of the electromagnetic shielding that defines the primary electromagnetically shielded region (in which the electronic device resides) and a second portion of the electromagnetic shielding that defines a secondary electromagnetically shielded region (in which the filter resides) are in electrically conductive contact, while in other example implementations, the first and second regions of the electromagnetic shielding are not in electrically conductive contact. FIG. 3D illustrates an example configuration in which the electromagnetic shielding 232 defining the primary electromagnetically shielded region 220 is absent from electrically conductive contact with the electromagnetic shielding 234 defining the secondary electromagnetically shielded region 225.

In some example implementations, at least a portion of the electromagnetic shielding may be provided by an electrically conductive plane of a printed circuit board. For example, at least a portion of the secondary electromagnetically shielded region may be enclosed by an electrically conductive plane of a printed circuit board. Example implementations of such embodiments are illustrated in FIGS. 4A-4C.

In some example implementations, the electronic device is connected to the filter through a conductive trace of the printed circuit board, with the filter and the electronic device being connected to the conductive trace by respective vias formed within the printed circuit board. The electromagnetic shielding may be defined such that the first electromagnetically shielded region and the second electromagnetically shielded region are laterally separated on a common side of the printed circuit board. The electrical conductor may be connected to the filter through an additional via defined within the printed circuit board.

Figure 4A:
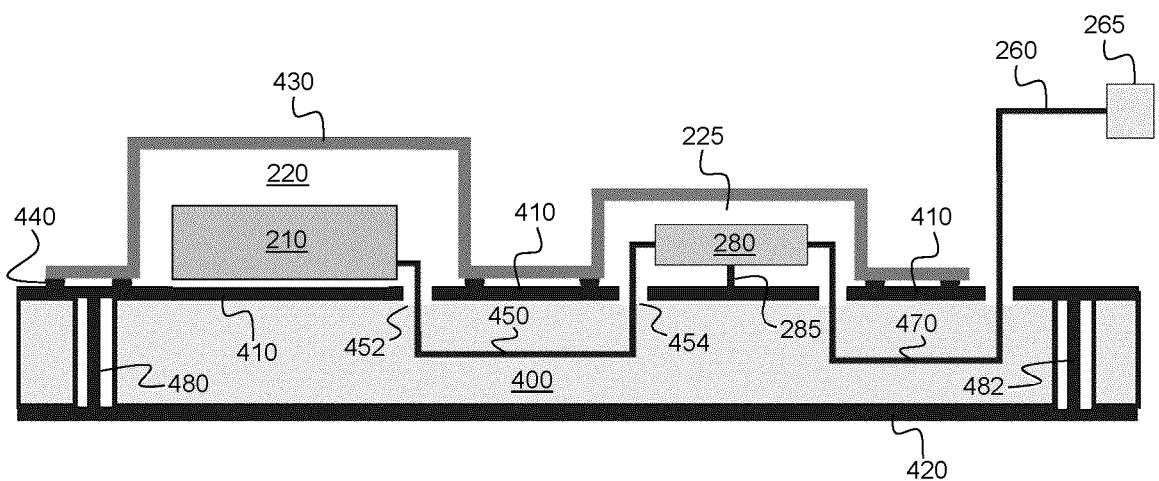
FIG. 4A shows an example implementation of an electronic assembly that houses an electronic device within an electromagnetic shield, in which a portion of the electromagnetic shield is defined by an electrically conductive plane of a printed circuit board. The electronic device is coupled, through a filter, to an electronic component that extends beyond the electromagnetic shield. The filter resides within a separate electromagnetically shielded region that is laterally adjacent from an electromagnetically shielded region within which the electronic device resides. The electronic device is housed such that it is absent from electrically conductive contact with the electromagnetic shielding. Electromagnetic energy generated by the electronic device is prevented from externally radiated beyond the electromagnetic shield, despite the extension of the external electrical component beyond the electromagnetic shielding.
Figure 4B:
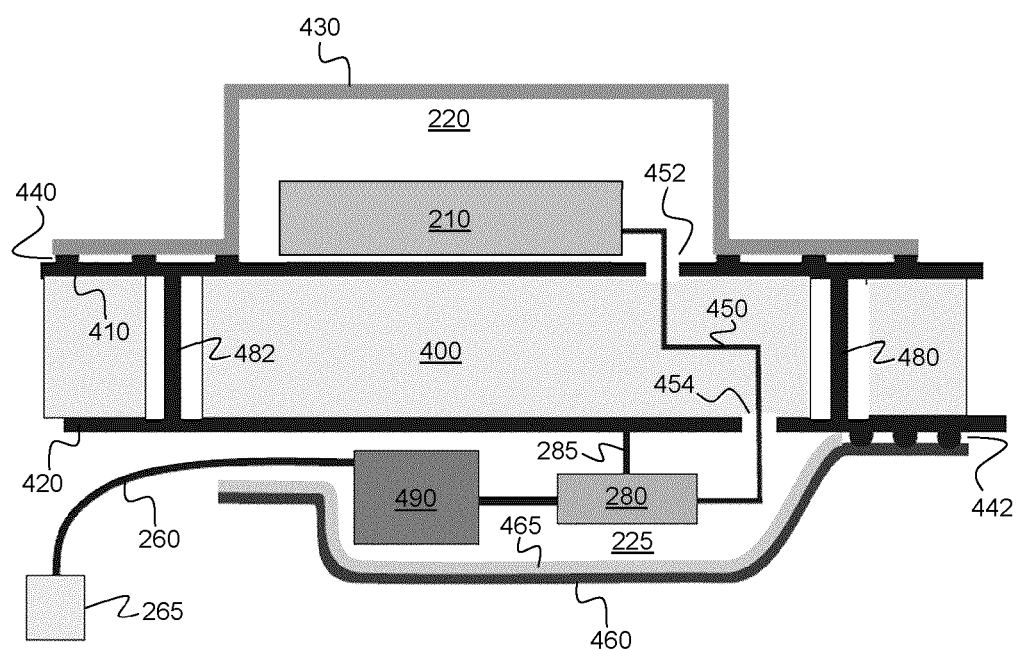
FIG. 4B shows an alternative example implementation of an electronic assembly that houses an electronic device within an electromagnetic shield, in which a portion of the electromagnetic shield is defined by an electrically conductive plane of a printed circuit board. The electronic device is coupled, through a filter, to an electronic component that extends beyond the electromagnetic shield. The filter resides within a separate electromagnetically shielded region that is defined on an opposing side of the printed circuit board from an electromagnetically shielded region within which the electronic device resides. The electronic device is housed such that it is absent from electrically conductive contact with the electromagnetic shielding. Electromagnetic energy generated by the electronic device is prevented from externally radiating beyond the electromagnetic shield, despite the extension of the external electrical component beyond the electromagnetic shielding.
Figure 4C:
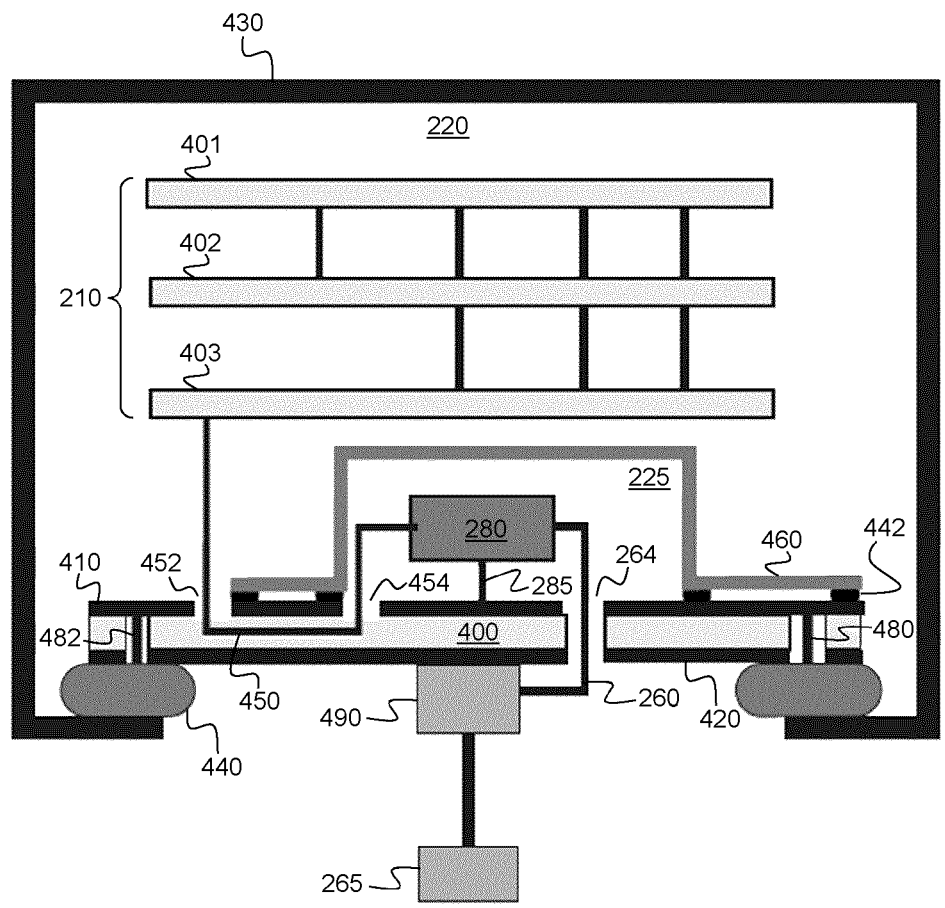
FIG. 4C shows an alternative example implementation of an electronic assembly that houses an electronic device within an electromagnetic shield, in which a portion of the electromagnetic shield is defined by an electrically conductive plane of a printed circuit board. The electronic device is coupled, through a filter, to an electronic component that extends beyond the electromagnetic shield. The filter resides within a separate electromagnetically shielded region that is defined on a common side of the printed circuit board relative to an electromagnetically shielded region within which the electronic device resides. The electronic device is housed such that it is absent from electrically conductive contact with the electromagnetic shielding. Electromagnetic energy generated by the electronic device is prevented from externally radiating beyond the electromagnetic shield, despite the extension of the external electrical component beyond the electromagnetic shielding.

An illustrative example of such embodiments is shown in FIG. 4A, which shows a circuit board 400 having a first conductive plane 410 and a second conductive plane 420. Electromagnetic shielding 430 is disposed over and brought into electrically conductive contact (e.g. via a conductive gasket or solder connections 440) with the first conductive plane 410 to enclose and separately shield the first electromagnetically shielded region 220 and the second electromagnetically shielded region 225.

The electronic device 210, which generates radiofrequency energy, is housed within the first electromagnetically shielded region 220. It will be understood that electronic device 210 need not be physically separated or offset from the printed circuit board and can instead include one or more electrical components (e.g. integrated circuits, clocks, capacitors, resistors, inductors, and other electronic components) mounted on the printed circuit board 400, provided that they are not in electrically conductive contact with the conductive plane(s) of the printed circuit board that form the portion of the electromagnetic shielding.

The filter 280 resides within the second electromagnetically shielded region 225 and couples the electronic device 210 to the external electronic component 265. The filter 280 is in electrically conductive contact with the electronic device 210 through an internal trace 450 defined within the printed circuit board 400. The internal trace 450 is in electrically conductive communication with the electronic device 210 and the filter 280 through vias 452 and 454. The filter 280 is also connected to the first conductive plane 410, as shown at 285, such that radiofrequency signals generated by the electronic device can be directed, within a blocking bandwidth of the filter, to the electromagnetic shielding, within the secondary electromagnetically shielded region 225.

The filter 280 is in electrically conductive communication with the electrical conductor 260 and the external electronic component 265 through a second internal trace 470.

It will be understood that the filter 280 need not be physically separated from the printed circuit board 400 and can instead be mounted on the printed circuit board. In such an implementation, the filter 280 can be electrically connected, at least in part, to the electronic device 210 and the external conductor 265 via traces on the printed circuit board 400, and the filter 280 can be electrically connected to the conductive plane 410 of the printed circuit board (e.g. as shown at 285).

The first conductive plane 410 and the second conductive plane 420 may be connected through one or more vias, such as vias 480 and 482. While only one conductive plane may be employed to form a portion of the electromagnetic shielding, the second conductive plane 420 may be useful in electromagnetically shielding the internal trace 450. Moreover, the second conductive plane 420 provides a continuous shielding plane, unlike the first conductive plane 410, which is broken because it resides on the surface of the printed circuit board 400 where components that make up the electronic device 210 are placed.

In other example implementations, alternative shielding structures may be employed in place of the second conductive plane 420. For example, an additional electromagnetic shield structure may be provided below the printed circuit board 400 to provide electromagnetic shielding for vias defined within the printed circuit board and/or conductive traces defined on or within the printed circuit board. For example, a large piece of conductive tape (e.g. copper tape) could be used to form the lower electromagnetic shielding.

In other example embodiments involving the use of a printed circuit board for electromagnetic shielding, the electromagnetic shielding may be defined such that the primary electromagnetically shielded region (in which the electronic device resides) and the secondary electromagnetically shielded region (within which the filter resides) reside on opposing sides of the printed circuit board.

An illustrative example of such an embodiment is shown in FIG. 4B, which, like FIG. 4A, shows a circuit board 400 having a first conductive plane 410 and a second conductive plane 420. First electromagnetic shielding 430 is disposed over and brought into electrically conductive contact (e.g. via a conductive gasket or solder connections 440) with the first conductive plane 410 to enclose the first electromagnetically shielded region 220. The second electromagnetically shielded region 225 is enclosed, on an opposing side of the printed circuit board 400, by second electromagnetic shielding, which, in the present example implementation, is formed between the second conductive plane 420 by a flexible electrically conductive sheet 460 (e.g. electrically conductive tape). The electrically conductive sheet is in conductive electrical contact with the second conductive plane 420, for example, by solder or a conductive adhesive, as shown at 442.

The electronic device 210, which generates radiofrequency energy, is housed within the first electromagnetically shielded region 220. The filter 280 resides within the second electromagnetically shielded region 225 and couples the electronic device 210 to the external electronic component 265. The filter 280 is in electrically conductive contact with the electronic device 210 through an internal trace 450 defined within the printed circuit board 400. The internal trace 450 is in electrically conductive communication with the electronic device 210 and the filter 280 through vias 452 and 454 (in alternative example implementations, a single via may be employed without an internal horizontal trace).

The filter 280 is in electrically conductive communication with the electrical conductor 260 and the external electronic component 265, optionally through a connector 490. The electrical conductor 260 extends externally through a gap between the electrically conductive sheet 460 and the second conductive plane 420 of the printed circuit board 400, without being brought into electrically conductive communication with the electromagnetic shielding (i.e. without conductively contacting either the second conductive plane 420 or the electrically conductive sheet 460). An insulating later 465 may be provided between the electrically conductive sheet 460 and the connections to the filter 280. For example, the underside of the electrically conductive sheet 460 may be coated with an electrically insulating layer, or, for example, a separate insulating layer may be provided between the electrically conductive sheet 460 and the connections to the filter 280.

The first conductive plane 410 and the second conductive plane 420 are connected through one or more vias, such as vias 480 and 482. The filter 280 is connected to the second conductive plane 420, as shown at 285, such that radiofrequency signals generated by the electronic device can be directed, within a blocking bandwidth of the filter, to the electromagnetic shielding, within the secondary electromagnetically shielded region 225.

In other example embodiments involving the use of a printed circuit board for electromagnetic shielding, the electromagnetic shielding includes a first electromagnetically shielded enclosure supporting the printed circuit board and in electrically conductive communication with the electrically conductive plane of said printed circuit board such that the first electromagnetically shielded enclosure and the printed circuit board enclose and electromagnetically shield an internal volume, with the electromagnetic shielding further including a second electromagnetically shielded enclosure residing within the internal volume on the printed circuit board and in electrically conductive communication with the electrically conductive plane of the printed circuit board, such that the primary electromagnetically shielded region (housing the electronic device) is electromagnetically shielded by the first electromagnetically shielded enclosure, the second electromagnetically shielded enclosure, and a first portion of the electrically conductive plane of the printed circuit board, and where the secondary electromagnetically shielded region (housing the filter) is electromagnetically shielded by the second electromagnetically shielded enclosure and a second portion of the electrically conductive plane of said printed circuit board.

An illustrative example of such an embodiment is shown in FIG. 4C, which shows a circuit board 400 having a first conductive plane 410 and a second conductive plane 420. First electromagnetic shielding 430 is disposed over and brought into electrically conductive contact (e.g. via a conductive gasket or solder connections 440) with the second conductive plane 420 to enclose the first electromagnetically shielded region 220 (this connection could alternatively be made with the first conductive plane 410). The second electromagnetically shielded region 225 is enclosed by second electromagnetic shielding 460 that resides on the printed circuit board and is in conductive electrical contact with the first conductive plane 410, for example, by solder or a conductive adhesive, as shown at 442.

The electronic device 210, which, in the present example implementation, is represented by multiple stacked and connected printed circuit boards 401-403, generates radiofrequency energy, is housed within the first electromagnetically shielded region 220.

The filter 280 resides within the second electromagnetically shielded region 225 and couples the electronic device 210 to the external electronic component 265. The filter 280 is in electrically conductive contact with the electronic device 210 through an internal trace 450 defined within the printed circuit board 400. The internal trace 450 is in electrically conductive communication with the electronic device 210 and the filter 280 through vias 452 and 454 (in alternative example implementations, a single via may be employed without an internal horizontal trace).

The filter 280 is in electrically conductive communication with the electrical conductor 260 and the external electronic component 265, optionally through a connector 490. The electrical conductor 260 extends through a via in the printed circuit board 400, without being brought into electrically conductive communication with the electromagnetic shielding (i.e. without conductively contacting either of the conductive planes).

The first conductive plane 410 and the second conductive plane 420 are connected through one or more vias, such as vias 480 and 482. The filter 280 is connected to the first conductive plane 410, as shown at 285, such that radiofrequency signals generated by the electronic device can be directed, within a blocking bandwidth of the filter, to the electromagnetic shielding, within the secondary electromagnetically shielded region 225.

The example embodiments of the present disclosure may be employed to achieve improved electromagnetic shielding of electronic devices employed within the scanner room of a magnetic resonance imaging system, and optionally within the bore of a magnetic resonance imaging scanner. For example, the present example embodiments may be employed to prevent or reduce the impact of radiofrequency energy emitted by an electronic device on the images acquired by the magnetic resonance imaging scanner. In such cases, the electrical filter is configured to block (reject) the transmission of radiofrequency energy external to the electromagnetic shielding. It is noted that the electromagnetic shielding need not be broadband and need only provide shielding within the operating bandwidth of the magnetic resonance imaging scanner.

It will be understood that the aforementioned applications involving the use of the present example embodiments for shielding electronic devices proximal to a magnetic resonance imaging scanner are merely example applications and are not intended to limit the scope of the present disclosure. Indeed, it is envisioned that the preceding example embodiments may be adapted to a wide variety of applications where it is desirable to limit RF emissions, only some of which involve imaging or sensing. Non-limiting examples of other applications of the present example embodiments include electronics for aviation, electronics for military or surveillance equipment where detection is possible through the emissions of electromagnetic radiation, electronics for radio-frequency testing laboratories, electronics for telecommunications testing, electronics for use in an electromagnetically shielded environment, and/or electronics/applications having associated electromagnetic emission or electromagnetic compatibility standards.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

Therefore what is claimed is:

1. A magnetic resonance system comprising:
a magnetic resonance imaging scanner; and
an electronic assembly comprising:
electromagnetic shielding defining a first electromagnetically shielded region and a second electromagnetically shielded region, said second electromagnetically shielded region being electromagnetically shielded from said first electromagnetically shielded region, wherein said first electromagnetically shielded region and said second electromagnetically shielded region are electromagnetically shielded within at least an operating bandwidth of said magnetic resonance imaging scanner;
an electronic device residing within said first electromagnetically shielded region;
an electrical conductor extending, at least in part, external to said electromagnetic shielding; and
a filter residing within said second electromagnetically shielded region, said filter coupling said electronic device to said electrical conductor through conductive pathways extending through respective portals within said electromagnetic shielding defining said second electromagnetically shielded region, said filter being in electrically conductive contact with said electromagnetic shielding within said second electromagnetically shielded region, wherein said filter is configured such that radio-frequency electromagnetic energy generated by said electronic device within the operating bandwidth of said magnetic resonance imaging scanner is directed, within said second electromagnetically shielded region, to said electromagnetic shielding, through said contact with said electromagnetic shielding;
wherein said electronic device is absent of electrically conductive contact with said electromagnetic shielding and is operable in the absence of connection to a reference potential associated with said electromagnetic shielding, thereby preventing, at least in part, the radio-frequency electromagnetic energy from being radiatively coupled external to said electromagnetic shielding and interfering with said magnetic resonance imaging scanner.

2. The magnetic resonance system according to claim 1 wherein said electromagnetic shielding comprises a barrier separating said first electromagnetically shielded region from said second electromagnetically shielded region.

3. The magnetic resonance system according to claim 2 wherein said second electromagnetically shielded region is surrounded, at least in part, by said first electromagnetically shielded region.

4. The magnetic resonance system according to claim 1 wherein said first electromagnetically shielded region is spatially separated from said second electromagnetically shielded region.

5. The magnetic resonance system according to claim 1 wherein a first portion of said electromagnetic shielding that defines said first electromagnetically shielded region and a second portion of said electromagnetic shielding that defines said second electromagnetically shielded region are in electrically conductive contact.

6. The magnetic resonance system according to claim 1 wherein at least a portion of said second electromagnetically shielded region is enclosed by an electrically conductive plane of a printed circuit board.

7. The magnetic resonance system according to claim 6 wherein said electronic device is connected to said filter through a conductive trace of said printed circuit board, said filter and said electronic device being connected to said conductive trace by respective vias formed within said printed circuit board.

8. The magnetic resonance system according to claim 7 wherein said electromagnetic shielding is defined such that said first electromagnetically shielded region and said second electromagnetically shielded region are laterally separated on a common side of said printed circuit board.

9. The magnetic resonance system according to claim 7 wherein said conductive trace is a first conductive trace, and wherein said electrical conductor is connected to said filter through a second conductive trace.

10. The magnetic resonance system according to claim 7 wherein said electrical conductor is connected to said filter through an additional via defined within said printed circuit board.

11. The magnetic resonance system according to claim 7 wherein said electromagnetic shielding comprises a first electromagnetically shielded enclosure supporting said printed circuit board and in electrically conductive communication with said electrically conductive plane of said printed circuit board such that said first electromagnetically shielded enclosure and said printed circuit board enclose and electromagnetically shield an internal volume, said electromagnetic shielding further comprising a second electromagnetically shielded enclosure residing within said internal volume on said printed circuit board and in electrically conductive communication with said electrically conductive plane of said printed circuit board, such that said first electromagnetically shielded region is electromagnetically shielded by said first electromagnetically shielded enclosure, said second electromagnetically shielded enclosure, and a first portion of said electrically conductive plane of said printed circuit board, and wherein said second electromagnetically shielded region is electromagnetically shielded by said second electromagnetically shielded enclosure and a second portion of said electrically conductive plane of said printed circuit board.

12. The magnetic resonance system according to claim 11 wherein said electrical conductor is connected to said filter through an additional via defined within said printed circuit board.

13. The magnetic resonance system according to claim 6 wherein said electromagnetic shielding is defined such that said first electromagnetically shielded region and said second electromagnetically shielded region reside on opposing sides of said printed circuit board.

14. The magnetic resonance system according to claim 13 wherein said electronic device is connected to said filter through a via within said printed circuit board.

15. The magnetic resonance system according to claim 14 wherein said first electromagnetically shielded region is formed by an electromagnetically shielded enclosure residing on a first side of said printed circuit board, and wherein said second electromagnetically shielded region is defined, at least in part, by a flexible electrically conductive sheet adhered to a second side of said printed circuit board such that said filter is covered by said flexible electrically conductive sheet, said flexible electrically conductive sheet being connected to said electrically conductive plane of said printed circuit board, and wherein said electrical conductor is connected to said filter through a gap between said printed circuit board and said flexible electrically conductive sheet without electrically contacting said flexible electrically conductive sheet.

16. The magnetic resonance system according to claim 15 wherein an internal surface of said flexible electrically conductive sheet is electrically insulating.

17. The magnetic resonance system according to claim 6 wherein said filter is in electrically conductive communication with said electrically conductive plane of said printed circuit board.

18. The magnetic resonance system according to claim 1 wherein said electrical conductor is, or is electrically connected to, an antenna.

19. The magnetic resonance system according to claim 1 wherein said filter is a first filter and said electrical conductor is a first electrical conductor, said electronic assembly further comprising a second filter residing within said second electromagnetically shielded region, said second filter coupling said electronic device to a second electrical conductor and being configured such that radio-frequency electromagnetic energy within the operating bandwidth of said magnetic resonance imaging scanner is directed, within said second electromagnetically shielded region, to said electromagnetic shielding.

20. The magnetic resonance system according to claim 19 wherein said first electrical conductor and said second electrical conductor are connected to a speaker.

21. The magnetic resonance system according to claim 1 wherein said electronic device is configured to receive, through said electrical conductor, electrical signals generated external to said electromagnetic shielding and is unable to transmit electrical signals to said electrical conductor.

22. The magnetic resonance system according to claim 1 wherein said electronic device is configured to transmit electrical signals through said electrical conductor and is unable to receive electrical signals transmitted through said electrical conductor.

23. The magnetic resonance system according to claim 1 wherein said electronic device is configured to transmit electrical signals to and/or receive electrical signals through said electrical conductor.

24. The magnetic resonance system according to claim 1 wherein said filter is a first filter and said electrical conductor is a first electrical conductor, said electronic assembly further comprising a second filter residing within said second electromagnetically shielded region or within another electromagnetically shielded region that is electromagnetically shielded from said first electromagnetically shielded region, said second filter coupling said electronic device to a second electrical conductor residing, at least in part, external to said electromagnetic shielding, said second filter being in electrically conductive contact with said electromagnetic shielding within said second electromagnetically shielded region or said another electromagnetically shielded region, wherein said second filter is configured such that radio-frequency electromagnetic energy generated by said electronic device within the operating bandwidth of said magnetic resonance imaging scanner is directed, within said second electromagnetically shielded region or said another electromagnetically shielded region, to said electromagnetic shielding, through said contact with said electromagnetic shielding.

25. The magnetic resonance system according to claim 24 wherein said electronic device is configured to transmit first electrical signals through said first electrical conductor and to receive second electrical signals through said second electrical conductor.

26. A shielded electronic assembly comprising:
electromagnetic shielding defining a first electromagnetically shielded region and a second electromagnetically shielded region, said second electromagnetically shielded region being electromagnetically shielded from said first electromagnetically shielded region;
an electronic device residing within said first electromagnetically shielded region;
an electrical conductor extending, at least in part, external to said electromagnetic shielding; and
a filter residing within said second electromagnetically shielded region such that said filter is spatially and electromagnetically sequestered within said second electromagnetically shielded region, said filter coupling said electronic device to said electrical conductor through conductive pathways extending through respective portals within said electromagnetic shielding defining said second electromagnetically shielded region, said filter being in electrically conductive contact with said electromagnetic shielding within said second electromagnetically shielded region, wherein said filter is configured such that radio-frequency electromagnetic energy generated by said electronic device within a blocking frequency band of said filter is directed, within said second electromagnetically shielded region, to said electromagnetic shielding, through said contact with said electromagnetic shielding;
wherein said electronic device is absent of electrically conductive contact with said electromagnetic shielding and is operable in the absence of connection to a reference potential associated with said electromagnetic shielding, thereby preventing, at least in part, radio-frequency electromagnetic energy within the blocking band of said filter from being radiatively coupled external to said electromagnetic shielding.

* * * * *